(12) United States Patent
Pandey et al.

(10) Patent No.: US 9,966,313 B2
(45) Date of Patent: May 8, 2018

(54) FINFET DEVICE AND METHOD OF MANUFACTURING

(71) Applicant: GLOBALFOUNDRIES Inc., Grand Cayman (KY)

(72) Inventors: Shesh Mani Pandey, Saratoga Springs, NY (US); Baofu Zhu, Clifton Park, NY (US); Srikanth Balaji Samavedam, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/229,431

(22) Filed: Aug. 5, 2016

(65) Prior Publication Data
US 2018/0040516 A1    Feb. 8, 2018

(51) Int. Cl.
*H01L 21/8234* (2006.01)
*H01L 27/088* (2006.01)

(52) U.S. Cl.
CPC ........... *H01L 21/823481* (2013.01); *H01L 21/823431* (2013.01); *H01L 21/823468* (2013.01); *H01L 27/0886* (2013.01)

(58) Field of Classification Search
CPC ............ H01L 21/823431; H01L 27/0886
See application file for complete search history.

(56) References Cited

U.S. PATENT DOCUMENTS 8,759,943 B2    6/2014    Tseng et al.

*Primary Examiner* — David Vu
(74) *Attorney, Agent, or Firm* — Ditthavong & Steiner, P.C.

(57) ABSTRACT

A method for producing a finFET having a fin with thinned sidewalls on a lower portion above a shallow trench isolation (STI) regions is provided. Embodiments include forming a fin surrounded by STI regions on a substrate; recessing the STI regions, revealing an upper portion of the fin; forming a spacer over side and upper surfaces of the upper portion of the fin; recessing the STI regions, exposing a lower portion of the fin; and thinning sidewalls of the lower portion of the fin.

10 Claims, 4 Drawing Sheets

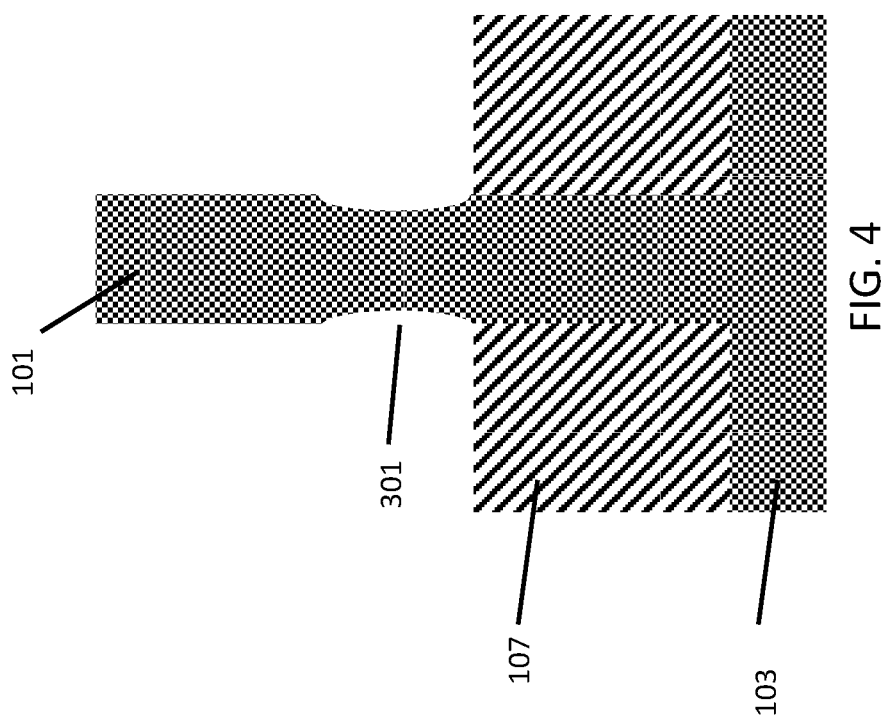

FINFET DEVICE AND METHOD OF MANUFACTURING

TECHNICAL FIELD

The present disclosure relates to semiconductor fabrication. In particular, the present disclosure relates to fin field effect transistor (FinFET) fabrication.

BACKGROUND

FinFET devices are integrated into different types of semiconductor devices. FinFET devices typically include semiconductor fins with high aspect ratios in which the channel and source/drain regions for the transistor are formed. A gate is formed over and along the sides of a portion of the semiconductor fins. The increased surface area of the channel and source/drain regions in a FinFET results in faster, more reliable and better-controlled semiconductor transistor devices.

Current FinFET technology, however, has challenges. For example, a slightly larger top fin critical dimension (CD) is desirable to achieve better drive current, but the bottom fin CD needs to remain small to avoid short channel effects (SCE). However, top fin CD and bottom fin CD cannot be controlled independently.

A need therefore exists for methodology enabling fabrication of FinFET devices with a larger top fin CD than a bottom fin CD and the resulting devices.

SUMMARY

An aspect of the present disclosure is a method for providing top fin CD that is ideal for drive current and subsequently recessing the bottom fin to have better SCE, thereby improve overall device performance.

Another aspect of the present disclosure is a device including a larger top fin CD than bottom fin CD for improved drive current and better SCE concurrently.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a fin surrounded by shallow trench isolation (STI) regions on a substrate; recessing the STI regions, revealing an upper portion of the fin; forming a spacer over side and upper surfaces of the upper portion of the fin; recessing the STI regions, exposing a lower portion of the fin; and thinning sidewalls of the lower portion of the fin.

Aspects of the present disclosure include forming a hardmask on the upper surface of the fin prior to forming the spacer. Other aspects include forming a nitride spacer over the side and upper surfaces of the upper portion of the fin. Yet further aspects include recessing the STI regions by wet or dry etching the STI region to expose the lower portion of the fin. Another aspect includes the exposed lower portion representing 10 to 60% of the fin above the upper surface of the STI region. Other aspects include forming the STI region of an oxide. Another aspect includes thinning the sidewalls of the lower portion of the fin by wet or dry etching, the thinned region of the fin having a height from 5% to 70% of the overall fin height. Yet another aspect includes removing the spacer from the upper portion of the fin after thinning of the sidewalls. Other aspects include patterning the gate dielectric layer and gate electrode layer to form a gate stack.

Another aspect of the present disclosure is a device including: a substrate; a finFET on the substrate, wherein the fin includes a thinned region on sidewalls of a lower portion of the fin; and a STI region below the thinned region of the lower portion of the fin.

Aspects include the thinned region having a height that is between 5% to 70% of the overall fin height. A further aspect includes forming a gate dielectric layer and gate electrode layer over the fin and STI region after removing the spacer. Other aspects include the thinned region extending into sides of the fin to a maximum depth of 5 nm. Yet further aspects include the thinned region extending into sides of the fin to a minimum depth of 1 nm. Another aspect includes the thinned region being a semi-ellipsoid shape.

Yet another aspect of the present disclosure is a method including: forming a fin on a semiconductor substrate; forming a STI region on sides of the fin; recessing the STI region, revealing only an upper portion of the fin; forming a nitride spacer over an upper portion of the fin and over the STI region; recessing the STI region to expose a lower portion of the fin, the exposed lower portion of the fin being above an upper surface of the STI region; and etching the lower portion of the fin to form a semi-ellipsoid shape in each side of the fin, the semi-ellipsoid shape having a depth of 1 to 5 nm into the sides of the fin and a height from 5% to 70% of the fin height.

Aspects include removing the nitride spacer from the upper portion of the fin after forming the semi-ellipsoid shape. Other aspects include forming a gate dielectric layer and gate electrode layer over the fin and STI region after removing the nitride spacer. Additional aspects include patterning the gate dielectric layer and gate electrode layer to form a gate stack. Further aspects include wet or dry etching the lower portion of the fin to form the semi-ellipsoid shape.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1 through 4 schematically illustrate in cross-sectional views, a process for fabricating a finFET device, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of leakage and reduced drive current attendant upon conventional finFET device fabrication. In accordance with embodiments of the present disclosure, a top fin CD that is ideal for drive current and a bottom fin having better SCE are produced to improve overall device performance and prevent leakage.

Methodology in accordance with embodiments of the present disclosure includes forming a fin surrounded STI regions on a substrate; recessing the STI regions, revealing an upper portion of the fin; forming a spacer over side and upper surfaces of the upper portion of the fin; and thinning sidewalls of the lower portion of the fin.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
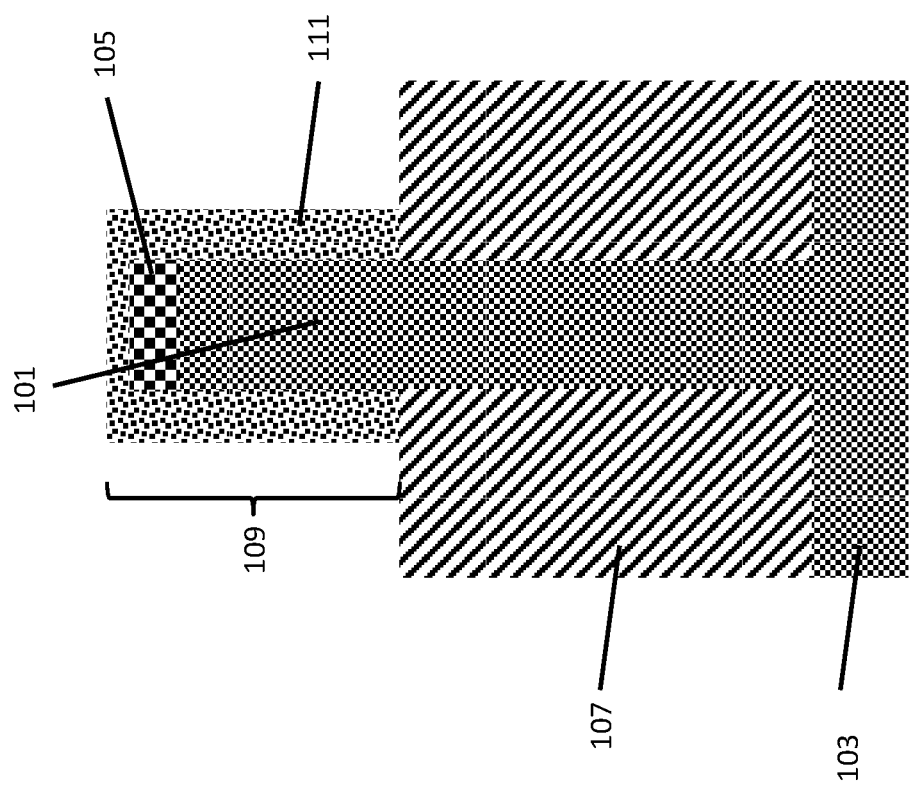

Adverting to FIG. 1, fins 101 are formed over a substrate 103, for example a silicon substrate. Other examples of materials that may be suitable for use in the substrate include silicon-on-insulator (SOI), silicon-germanium (SiGe), germanium, and/or compound semiconductor materials. Processes, such as photolithography and etch processes, can be used to create the fins 101. The fins 101 may include silicon. The fins 101 include the channels of a finFET and will be coupled to the source/drain regions of the finFET.

FinFETs use a substantially rectangular fin structure. For example, silicon on a substrate is etched into rectangular fin shape by first patterning and depositing a hardmask layer 105 on the bulk silicon. The hardmask 105 forms a pattern covering the top of the fins 101. The silicon is then etched to form trenches between the regions covered by the hardmask layer 105. The trenches are formed into STI regions 107 by depositing a dielectric material such as silicon oxide. The dielectric material is deposited in excess to completely cover the fins 101 and hardmask layer 105 and then planarized down to the top surface of the fin/hardmask 101/105. Then the dielectric material is etched to reveal the entirety of the fins. In accordance with the present disclosure, the dielectric material is etched or recessed to a level below the top of the fin 101 so that only an upper portion 109 of the fin 101 protrudes above the STI regions 107, as illustrated in FIG. 1. A nitride layer is deposited over the fin 101 to protect the top of the fin 101 during subsequent processing. A nitride spacer etch is performed on the nitride layer to form nitride spacers 111 over the side and upper surfaces of the upper portion 109 of the fin 101.

Figure 2:
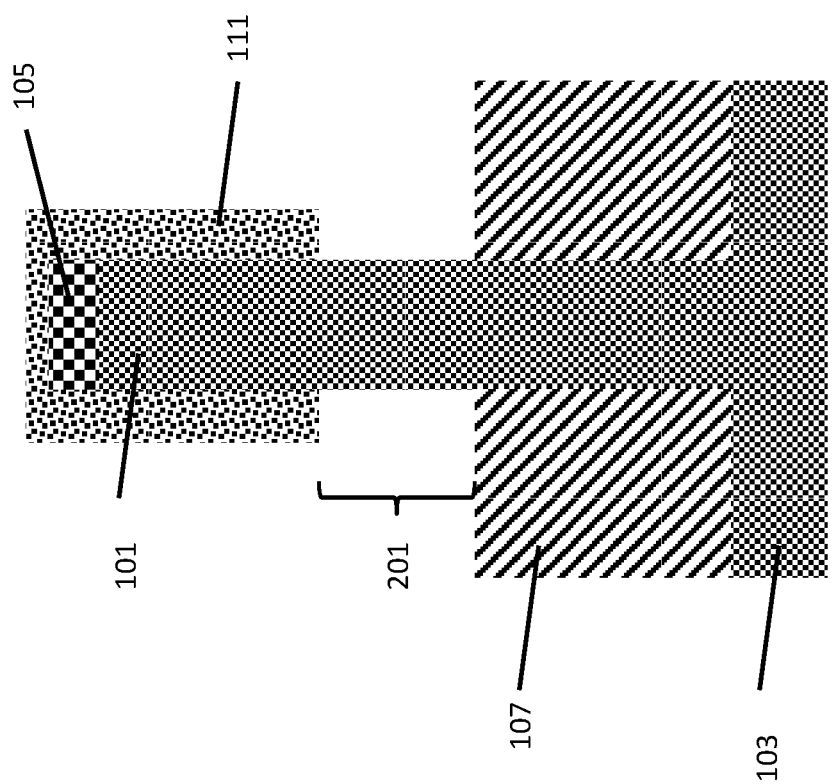

Adverting to FIG. 2, the STI regions 107 are again recessed, by wet or dry etching, to expose a lower portion 201 of the fin 101. The exposed lower portion 201 represents 10 to 60% of the fin 101 above the upper surface of the STI regions 107. In certain examples, the exposed lower portion 201 represents 30 to 40% of the fin 101 above the upper surface of the STI regions 107.

Figure 3:
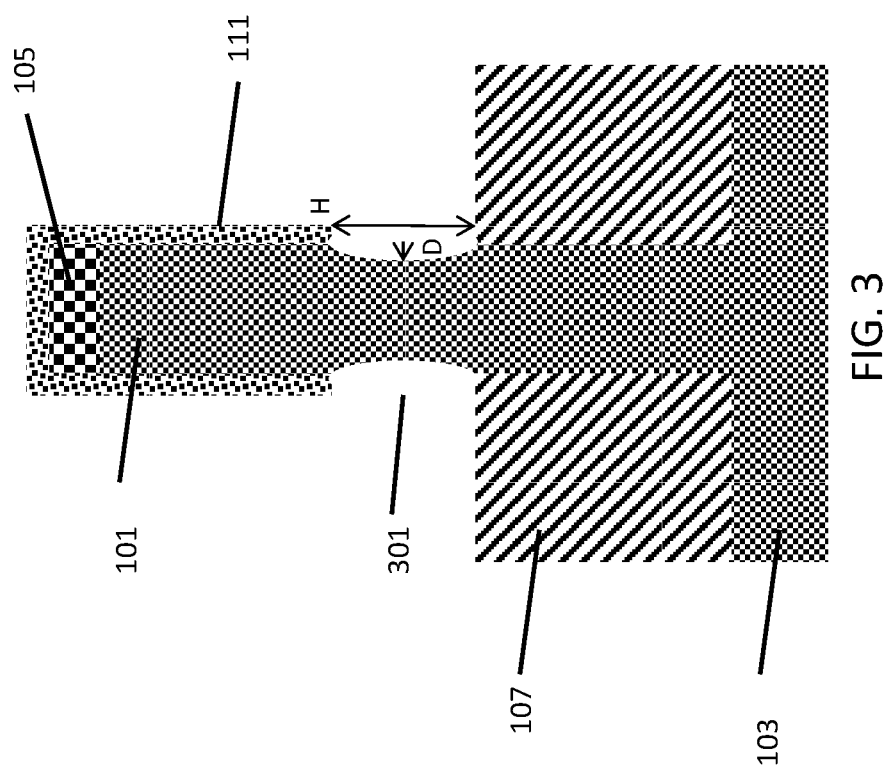

Adverting to FIG. 3, a recessing or thinning of the sides of the exposed lower portion 201 of the fin 101 is performed. The recessed or thinned region 301 of fins 101 is positioned above an upper surface of the STI regions 107. A wet or dry silicon etch is performed to form the recessed or thinned portion 301. The thinned or recessed region 301 is formed to a height H which is between 5% to 70% of the overall height of the fin. The thinned or recessed region 301 extends into sides of the fin to a minimum depth of 1 nm and a maximum depth D of 5 nm. In certain examples, the depth is not to exceed 1.5 nm such that the thickness of the fin 101 remains between 10 and 12 nm. As shown in FIG. 3, the thinned or recessed region is a semi-ellipsoid shape. The thickness of the nitride spacer 111 is also reduced during the wet or dry etching of the lower portion 201 of the fin 101. The thinned or recessed lower portion 301 of the fin 101 improves electrical performance of the finFET device by increasing drive current and improving SCE.

Adverting to FIG. 4, the nitride spacer 111 and hardmask layer 105 are removed. Additional finFET processing can then be performed. For example, a gate dielectric layer and gate electrode layer (not shown for illustrative convenience) are formed over the fin 101 and STI regions 107 after removing the nitride spacer 111. The gate dielectric layer is formed of a high dielectric constant (high-k) dielectric material. The gate electrode layer is formed on the gate dielectric layer. The gate dielectric layer and gate electrode layer are then patterned to form a gate structure. The gate structure (not shown for illustrative convenience) can be formed on and over the fins 101 and spacers may be provided on sides of the gate structure. The gate structure may include polysilicon, silicon-germanium, a metal including metal compounds such as, Mo, Cu, W, Ti, Ta, TiN, TaN, NiSi, CoSi, and/or other suitable conductive materials. The fin portions not under the gate structures are then optionally doped to form doped drain/source regions. Source/drain regions are formed at opposite sides of the gate structure.

The embodiments of the present disclosure can achieve several technical effects, including preventing leakage current in finFET devices caused by short-channel effects. The embodiments of the present disclosure provide a novel bottom fin recess technique for better finFET performance. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices using semiconductor fins in the advanced technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
    forming a fin surrounded by shallow trench isolation (STI) regions on a substrate;

recessing the STI regions, revealing an upper portion of the fin;
forming a spacer over side and upper surfaces of the upper portion of the fin;
recessing the STI regions, exposing a lower portion of the fin;
thinning sidewalls of the lower portion of the fin;
removing the spacer from the upper portion of the fin after thinning of the sidewalls;
forming a gate dielectric layer and gate electrode layer over the fin and STI region after removing the spacer; and
patterning the gate dielectric layer and gate electrode layer to form a gate stack,
wherein the lower potion of the fin remains above an uppermost surface of the STI regions after thinning of the sidewalls and after forming of the gate stack.

2. The method according to claim 1, further comprising:
forming a hardmask on the upper surface of the fin prior to forming the spacer.

3. The method according to claim 1, comprising:
forming a nitride spacer over the side and upper surfaces of the upper portion of the fin.

4. The method according to claim 1, comprising:
recessing the STI regions by wet or dry etching the STI region to expose the lower portion of the fin.

5. The method according to claim 1, wherein the exposed lower portion represents 10 to 60% of the fin above the upper surface of the STI region.

6. The method according to claim 1, comprising:
forming the STI region of an oxide.

7. The method according to claim 1, comprising:
thinning the sidewalls of the lower portion of the fin by wet or dry etching, the thinned region of the fin representing 5% to 70% of the overall fin height.

8. A method comprising:
forming a fin on a semiconductor substrate;
forming a shallow trench isolation (STI) region on sides of the fin;
recessing the STI region, revealing only an upper portion of the fin;
forming a nitride spacer over the upper portion of the fin and over the STI region;
recessing the STI region to expose a lower portion of the fin, the exposed lower portion of the fin being above an upper surface of the STI region;
etching the lower portion of the fin to form a semi-ellipsoid shape in each side of the fin, the semi-ellipsoid shape having a depth of 1 to 5 nm into the sides of the fin and the semi-ellipsoid shape representing 5% to 70% of the overall fin height;
removing the spacer from the upper portion of the fin after thinning of the sidewalls;
forming a gate dielectric layer and gate electrode layer over the fin and STI region after removing the spacer; and
patterning the gate dielectric layer and gate electrode layer to form a gate stack,
wherein the lower potion of the fin remains above an uppermost surface of the STI regions after thinning of the sidewalls and after forming of the gate stack.

9. The method according to claim 8, further comprising:
removing the nitride spacer from the upper portion of the fin after forming the semi-ellipsoid shape.

10. The method according to claim 8, comprising:
wet or dry etching the lower portion of the fin to form the semi-ellipsoid shape.

* * * * *